(12) United States Patent
Lupo et al.

(10) Patent No.: US 6,281,430 B1
(45) Date of Patent: Aug. 28, 2001

(54) ELECTRONIC DEVICE COMPRISING A COLUMNAR DISCOTIC PHASE

(75) Inventors: Donald Lupo, Dublin (IE); Akio Yasuda; Gabrielle Nelles, both of Stuttgart (DE)

(73) Assignee: Sony International (Europe) GmbH, Köln (DE)

( * ) Notice: Subject to any disclaimer, the term of this patent is extended or adjusted under 35 U.S.C. 154(b) by 0 days.

(21) Appl. No.: 09/500,765

(22) Filed: Feb. 8, 2000

(30) Foreign Application Priority Data

Feb. 9, 1999  (EP) .................................................. 99102473

(51) Int. Cl.[7] .............................. H01L 51/20; H01L 51/30
(52) U.S. Cl. .......................... 136/263; 136/252; 136/258; 257/40; 257/52; 257/53; 257/49; 257/431; 257/461; 438/82; 438/57; 438/96; 438/97; 250/200; 313/498; 313/499; 313/501; 252/299.3; 252/299.01; 429/111
(58) Field of Search ...................................... 136/263, 252, 136/258 AM, 258 PC; 257/40, 52, 53, 49, 431, 461; 438/82, 57, 96, 97; 250/200; 313/498, 499, 501; 429/111; 252/299.3, 299.01

(56) References Cited

U.S. PATENT DOCUMENTS

| | | | |
|---|---|---|---|
| 5,683,833 | 11/1997 | Haussling et al. | 429/192 |
| 6,099,750 | * 8/2000 | Simmerer et al. | 252/299.3 |

FOREIGN PATENT DOCUMENTS

| | | |
|---|---|---|
| 195 43 637 | 5/1997 | (DE) . |
| 990943 | * 4/2000 | (EP) . |
| WO 96 36082 | 11/1996 | (WO) . |
| WO 97/19142 | * 5/1997 | (WO) . |

OTHER PUBLICATIONS

Miteva et al, Synthetic Metals, vol. 111–112, pp. 173–176, (2000)(month unknown).*

Antohe S., Et Al: "Three–Layered Photovoltaic Cell with an Enlarged Photoactive Region of Codeposited Dyes" Journal De Physique III, vol. 6, No. 8, Aug. 1, 1996, pp. 1133–1144, XP000621594.

Tokuhisa H., Et Al: "Polarized Electroluminescence from Smectic Mesophase" Applied Physics Letters, vol. 72, No. 21, May 25, 1998, pp. 2639–2641, XP000765015.

* cited by examiner

Primary Examiner—Alan Diamond
(74) Attorney, Agent, or Firm—Frommer Lawrence & Haug LLP; William S. Frommer; Mark W. Russell

(57) ABSTRACT

An electronic device comprising two adjacent regions of materials with different electric properties is characterized in that one of the regions is formed by a columnar structure of a discotic liquid crystal material, said structure having interspaces defined between columns of said discotic liquid crystal material, said interspaces being part of the other region and comprising a second material having electric properties different from that of said discotic liquid crystal. The invention also relates to a method for producing an electronic structure for such devices.

20 Claims, 1 Drawing Sheet

ELECTRONIC DEVICE COMPRISING A COLUMNAR DISCOTIC PHASE

This invention relates to electronic devices having a structure on a nanometer scale and especially optoelectronic devices such as photovoltaic cells, photodetectors, electroluminescence devices and electrochromic devices. It especially relates to such devices comprising bicontinuous phase separated the structures.

Bicontinuous phase separated systems with phase separation on a nanometer scale have received increasing attention during the last years. Especially, systems incorporating nanostructured titanium oxide and an organic semiconductor or a fluid electrolyte have been proposed for use as dye sensitized solar cells, electroluminescent devices and electrochromic devices. In these systems the interface between the two phases is up to several hundred times larger than in the conventional flat layer systems. An increased interface between the two phases is advantageous in many respects, for example in that it improves the charge separation in solar cells or the charge carrier injection in batteries or electroluminescent devices. Although these advantages can be realized by the nanoparticle titanium oxide structure according to the prior art, the use of titanium oxide or metal oxides in general has a disadvantage in that it implies a sintering step in a temperature range of about 450° C. to 500° C., requiring that the carrier of such structures is thermally stable at these elevated temperatures. This excludes polymer substrates which would be desirable otherwise because of their low weight and their low cost.

J. J. M. Halls et al., Nature 376 (1995), 498 proposed a photovoltaic cell comprising two continuous separated phases of conjugated polymers. In order to prepare this cell, a solution of a mixture of polymers was spincast onto a substrate. The mixture spontaneously separated into a dendritic bicontinuous phase with phase separation on a nanometer scale. Accordingly, the average distance between the point of light absorption and the junction between the two polymer phases was reduced to be less than the mean free paty of the quasiparticles created by the light absorption. In a solar cell prepared by the above-mentioned process each phase was in contact with both electrodes. In a further paper by M. Granström et al., Nature 395 (1998), 257 it was proposed to apply each of the two polymers to a separate substrate coated with an appropriate electrode and laminate the two parts thus created together in order to form a solar cell.

Although these approaches overcome the problem of a high temperature sintering step encountered with the metal oxide structures, they still have a drawback in that the interface between the two phases is established in a random manner so that the potential benefits of an interface having variations on a nanometer scale can not be fully achieved.

It is the object of the present invention to provide a method of preparing an electronic structure having variations on a nanometer scale with high predictability and in a controlled manner and to provide a new class of such structures having more precisely defined features on a nanometer scale.

This object is accomplished by an electronic device comprising two adjacent regions of materials with different electric properties, which is characterized in that one of the regions is formed by a columnar structure of a discotic liquid crystal material, said structure having interspaces defined between columns of said discotic liquid crystal material, said interspaces being part of the other region and comprising a second material having electric properties different from that of said discotic liquid crystal. Preferably, the columnar structure is stabilized, e.g. by cross-linking or by other suitable means, so that it is especially thermally and chemically stable and the columnar order is not destroyed or disturbed during the operation of the device, e.g. when heating up. A typical length scale for the interspaces is less than 100 nm and for most applications less than 10 nm.

Said two regions may form a bicontinuous phase separated system, the two phases interleaving each other in the region of the columns.

The invention may provide that the interspaces are filled with an amorphous phase.

Alternatively, it may be provided that the device comprises intercalated columns of two different discotic materials.

According to a specific embodiment said discotic material and said second material filling the interspaces between the columns of said discotic material are of a different conductivity type (p-type, n-type) so that a p-n junction is formed in the region of said columns.

The discotic material may especially be chosen from the group consisting of phthalocyanines and triphenylenes.

Especially said discotic material may comprise a triphenylene substituted with an acceptor group. It is preferred that said acceptor group is a trifluorosulphonic acid derivate.

The electronic device according to the invention can be an optoelectronic device, especially a photovoltaic cell, a photodetector, an electroluminescent device or an electrochromic device.

According to an embodiment of a photovoltaic cell the discotic columnar phase is preferably formed by a phthalocyanine. The conductive substrate onto which said columnar structure is deposited is preferably transparent to light and may consist of e.g. tin-doped indium oxide (ITO) or fluorine-doped tin oxide (FTO). Said interspaces between the columns are preferably filled with an amorphous phase of n-type oxadiazole.

In an embodiment as an electroluminescent device said columnar discotic structure is preferably formed by a triphenylene derivative.

The electronic device according to the invention can especially be an image sensor comprising a plurality of light detecting regions, each comprising a columnar structure of a discotic material as described above, and be adapted for detecting different light wavelengths in different light detecting regions.

The invention also provides a method of forming an electronic structure and for producing electronic devices comprising such structures, said method comprising the steps of applying a first layer of essentially parallely oriented discotic molecules to a substrate, depositing a second layer of a discotic material on said first layer, the material of said second layer being capable of forming a columnar discotic phase on the material of said first layer, said second layer containing interspaces between columns of discotic material opening to the surface of this layer, introducing a second material having electric properties different from those of the material of said second layer into at least some of the interspaces of said second layer.

The method may especially provide the step of crosslinking the molecules of the second layer at least in the longitudinal direction of a column. The materials may be made crosslinkable by substitution with groups such as epoxide or ethylene, which react with one another to create an insoluble network of covalently bonded molecules. The crosslinking may be effected by thermal radiation, by irradiation with X-rays or by ultraviolet (UV) radiation.

According to a preferred embodiment said first layer is linked to said substrate by chemisorption. In addition or alternatively the substrate may be treated with a surface modifying agent, especially an agent affecting the wettability and/or surface tension of the substrate. Suitable materials may be chosen from the group consisting of siloxanes, alkylthiols and polyimides. Said surface modifying agent is advantageously doped with charge transport material. As a further additional or alternative step the surface of the substrate may be prepared with a suitable surface geometry, e.g. by creating cavities with essentially parallel longitudinal axes. This may especially result in a step-like surface structure. Such structures may be prepared e.g. by oblique evaporation of $SiO_x$.

The invention can provide that a second layer deposited on said first layer is treated with a solvent to introduce defects, thereby creating or increasing interspaces between the columns.

The invention may also provide that the material of the second layer is deposited in a mixture with a second material, especially a solvent and that the second material is removed after deposition. If it is a solvent, it may be evaporated, for example. Preferably, the second layer is cross-linked prior to evaporating the solvent, more generally prior to removing said second material.

It may also be provided that the step of depositing the second layer comprises the step of depositing said discotic material with a defect inducing steric group and that it furthermore comprises the step of subsequently disassociating said steric group from said discotic material.

In a further embodiment the method comprises the additional step of depositing an intermediate, essentially defect-free layer of a discotic material on said first layer prior to depositing said second layer.

The invention relies on the surprising finding that it is possible to create a comparatively well defined structure having variations on a nanometer scale, especially bicontinuous phase separated systems, by making use of the property of discotic liquid crystals to form relatively regular columns. This was even more surprising, as this property per se is well known in the art. Discotic liquid crystals had been proposed for use in solar cells, e.g. in U.S. Pat. No. 5,683, 833, but no use was made of this property to form well defined geometries at a nanometer scale so far.

Further features, advantages and embodiments of the present invention will be apparent from the subsequent detailed description of an exemplary embodiment of the present invention with reference to the enclosed drawing.

Figure 1:
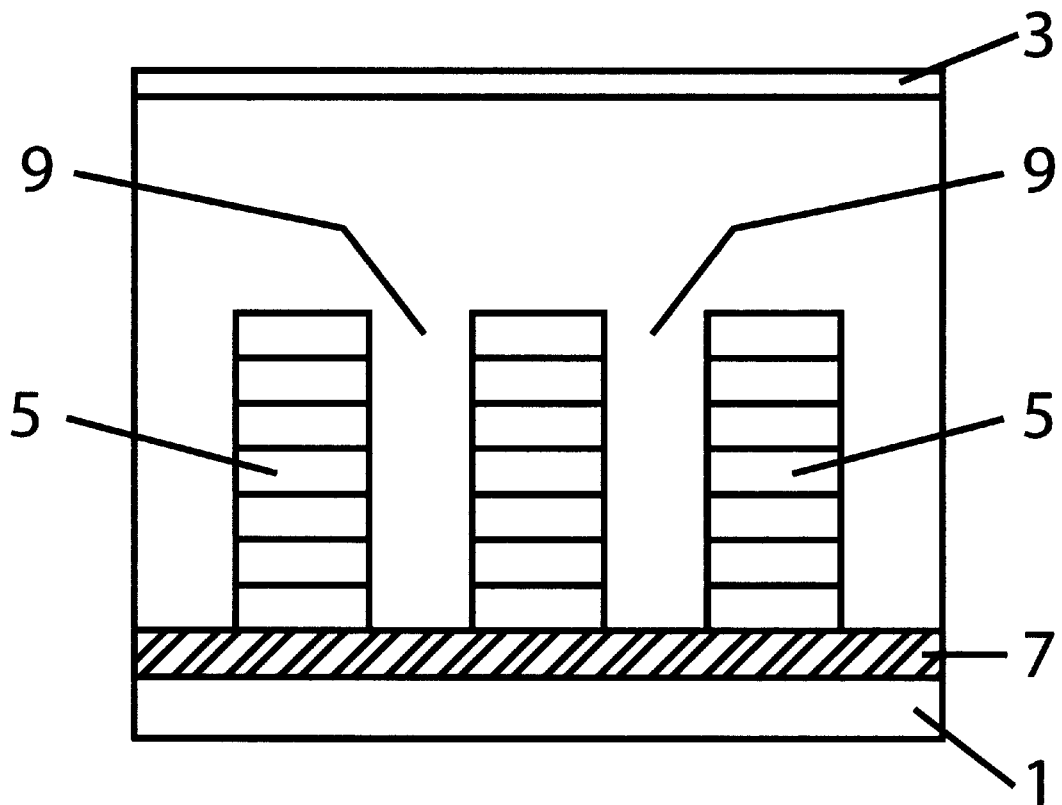
FIG. 1 schematically shows an idealized picture of the morphology of a device according to the present invention in an application as a solar cell.

In a conventional manner, the solar cell schematically shown in FIG. 1 comprises a pn-junction system between a transparent substrate 1 forming an electrode or having an electrode applied thereto and a low work function electrode 3. The p-type material is a discotic liquid crystal material forming columns 5 on a p-type surface layer 7. Between the columns 5 interspaces 9 are defined. These interspaces 9 are filled with an amorphous n-type material, which also covers the columns on top and fills the space between the columns 5 and electrode 3. The material of the surface layer 7 may be the same or different from that of the columns 5. The substrate preferably consists of a conducting material, especially a metal or, more preferably indium tin oxide (ITO) or fluorine doped indium tin oxide.

In order to prepare regular columns 5 which are about parallel, it is necessary to have the molecules in the first layer on which the columns are subsequently built up ordered in about the same direction, preferably parallel to the substrate. Especially, it should be avoided that these molecules tilt in an uncontrolled manner, resulting in a random orientation of the columns 5.

According to the invention, a first way to achieve this goal is to create a surface layer of the discotic material which is to build the columns 5, but substituted with groups which chemisorb to the substrate. Through chemisorption, a monolayer of highly oriented discotic molecules is deposited on the substrate. Typical appropriate groups for chemisorption may include for example carboxylic, sulfonic or phosphonic acid groups for attachment to transparent conducting oxide electrodes or thiol moieties for attachment to metals such as Ag and Au. On this surface layer, columns 5 are formed by depositing discotic material without said chemisorbing groups on said monolayer which will form a columnar phase, the highly oriented surface layer causing an essentially parallel growth of the columns.

A second way to achieve the formation of regular columns is to prepare a suitable geometry of the surface, e.g. by oblique evaporation of $SiO_x$, to form cavities with well defined longitudinal axes promoting the building of regular columns. Especially, by means of the, "self-shadowing effect" a step-like structure can be created which promotes the building of tilted columnar phases.

A third way is to modify the surface properties, especially the wettability and surface tension of the substrate, by depositing a thin layer of modifiying material to the substrate which may be advantageously doped with charge transport materials. Suitable materials may include, but are not limited to siloxanes, alkylthiols and polyimides, and may be applied by solvent casting or evaporation techniques or by physisorption or chemisorption.

The methods set out above may be used alone or in combination with each other.

In principle, once a first layer of highly oriented discotic molecules is created on the substrate 1, regular columns 5 will grow thereon when depositing discotic material. However, in order to create defined interspaces 9 between the columns that are to accommodate the n-type material, it is necessary to control the distance between the columns.

One way to vary the distance between the columns 5 is to chose the side groups or side chains of the discotic molecules to have an appropriate length.

According to a preferred embodiment of the invention, defects are created in the column structure grown on surface layer 7 leading to interspaces in which the n-type material may settle. A first way of creating such effects is to deposit a layer of columnar discotic material and to treat this layer with a solvent that introduces defects.

An alternative approach is to apply a layer of columnar discotic material in a mixture with a second material which can subsequently be washed away, e.g. by a solvent which does not dissolve the discotic material or by crosslinking the discotic material after deposition and before washing the second material away. Size and quantity of the interspaces will depend on the concentration of said second material. The discotic material may also be supplied in a mixture with a solvent which is subsequently removed, e.g. by evaporation. By varying the solvent concentration, the defect density can be varied. By introducing a solvent gradient or by applying layers with different solvent concentrations in subsequent steps the geometry of the interspaces can be varied in the longitudinal direction of the columns.

A third approach is to functionalize the material in the columns with defect inducing steric groups which are subsequently preferrably thematically or optically disassociated from the discotic material.

According to a preferred embodiment, when using this defect generating approach to define the interspaces, one proceeds by first depositing a highly ordered thin layer of discotic material forming a columnar phase with a thickness of about 15 nm and subsequently depositing one or more defect containing layers on this first layer, the columnar structure of the first layer inducing a columnar order in the subsequent layers. By varying the defect density of subsequent layers, the width of the interspaces can be modified in the vertical direction. Preferably, both horizontal and vertical crosslinking is effected after depositing each layer so that the interspace pattern gets fixed. According to the presently preferred embodiment, one applies a highly ordered monolayer of discotic material of the substrate prior to depositing said first defect-free layer, e.g. in one of the ways described previously, in order to get a highly regular columnar structure.

Materials which are suitable as p-type discotic materials are especially phthalocyanines and triphenylenes. Phthalocyanines are advantageous in that they can be used as optical absorbers in photodetectors and solar cells. Acceptor substituted triphenylenes have suitable electron transport properties which can be modified by choosing suitable acceptor groups. Trifluorosulfonic acid derivates are particularly preferred as acceptor groups, since they allow the addition of alkyl chains to stabilise the discotic phase. Charge transfer complexes can also be implemented, e.g. between triphenylene and trinitrofluorene.

EXAMPLE 1

Solar Cell

A layer consisting of a discotic phase of a Zinc phthalocyanine p-type conductor is prepared on an ITO substrate by the following steps.

(a) A monolayer of the following phthalocyanine (I) is chemisorbed onto a glass substrate coated with a 100 nm thick layer of tin-doped indium oxide (ITO).

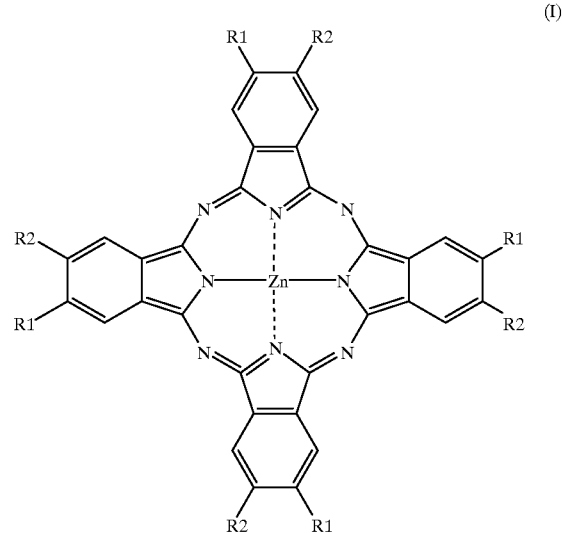

Where R1=n-decyl and R2=$CH_3(CH_2)_6$COOH (b) A layer of approximately 15 nm thickness of the following phthalocyanine (II) is deposited onto said monolayer, heated to the temperature of formation of the highly organized discotic phase and crosslinked through UV radiation while in the discotic phase, thus fixing the order of the phase.

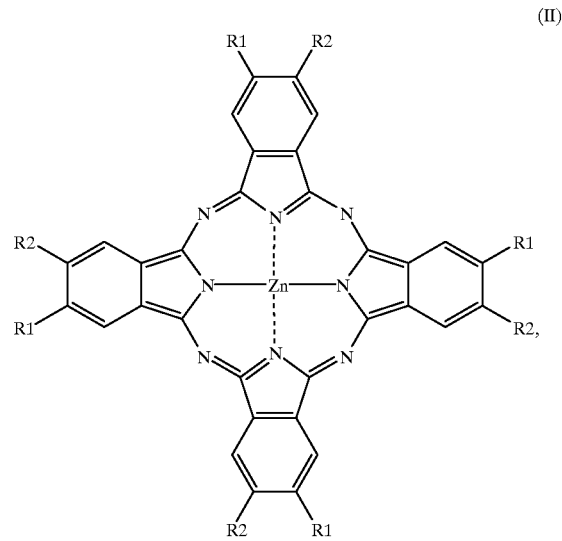

Where R1=n-decyl and R2=$CH_3(CH_2)_6CH\!=\!CH_2$ (c) A second layer of (II) mixed with cyclohexanone is deposited onto this first layer. Due to the mixture with solvent the second layer contains defects defining interspaces between the columns.

(d) following UV initiated crosslinking the solvent is evaporated.

A low melting point n-type oxadiazole is deposited into the crosslinked discotic layer such that and diffuses in the interspaces. Subsequently a cathode of 100 nm of Al is deposited. A thus prepared device, when exposed to sunlight, can show a high efficiency of charge separation and generate voltage and current, thereby functioning as a solar cell.

EXAMPLE 2

LED

On an ITO substrate a discotic phase of a triphenyline derivative having a specific defect density is prepared similarly to steps a) to d) of example 1. On the columnar phase thus created an interpenetrating layer of amorphous poly (alkylfluorene) is applied from a toluene solution. An electrode consisting of a LiF layer of about 5 nm followed by an Al layer of about 100 nm is subsequently applied. Upon application of a DC voltage the device emits blue light corresponding to the photoluminescence spectrum of the polyfluorene. In this example, the triphenylene facilitates the hole injection into the polyfluorene due to its lower oxidation potential. Due to the large surface area at the interface the charge injection is enhanced and the efficiency of the device and the maximum injectable current can be increased.

The columnar structure of the device according to the present invention has a specific advantage when applied to solar cells in that it allows a comparatively large thickness for absorption of the photons and yet a very short average distance from the site of absorption to the interface due to the interdigitated interface structure.

Although the examplary structure as described previously had a discotic phase and an amorphous phase, it is perfectly possible to have structures with two discotic phases penetrating each other. In principle, one could proceed as proposed in the prior art having two conjugated polymers that spontaneously separate. However, rather than applying both materials simultaneously and relying on the spontaneous separation, according to the invention first a columnar structure of one material is built and the second material is then allowed to settle in the interspaces between the columns of the first materials. It may also be contemplated to create a first monolayer in which the two phases are allowed to separate in an essentially two-dimensional pattern and then to grow columns of both materials on this monolayer, making use of the selectivity of the column-forming process.

The deposition of the discotic phase preferably occurs from the liquid phase. Generally vacuum deposition may also be contemplated.

Cross-linking may occur once after the columns are formed or sequentially in subsequent steps, e.g. part of a column is grown and cross-linked and subsequently a further layer is grown thereon and cross-linked and so on. Cross-linking may be effected by well known techniques, e.g. by employing epxoxide groups. Cross-linking should occur at least in the longitudinal (vertical) direction of the columns, although horizontal and vertical cross-linking is preferred.

The structure according to the invention may also be used in an advantageous manner with the concept of a solar cell. The absorbing dye may be different in different parts of the structure so that the device may be used as an image detector. Likewise, when used as an electroluminescent device, the structure may be configured such that it emits light at different wave lengths in different regions of the structure, making it especially useful for high resolution display purposes.

Whereas the previous example was described to have a p-type material as a discotic phase and a n-type material for the amorphous phase, and n-type material could as well be chosen for the discotic phase and a p-type material for the amorphous phase.

The features of the present invention disclosed in the specification, the claims and/or the drawings may, both separately and in any combination thereof, be material for realizing the invention in various forms thereof.

What is claimed is:

1. Electronic device comprising two adjacent regions of materials with different electric properties, characterized in that one of the regions is formed by a columnar structure of a discotic liquid crystal material, said structure having interspaces defined between columns of said discotic liquid crystal material, wherein said interspaces are part of the second region and are filled with a second material which comprises a material having electric properties different from that of said discotic liquid crystal.

2. Electronic device according to claim 1, characterized in that said two regions form a bicontinuous phase separated system, the two phases interleaving each other in the region of the columns.

3. Electronic device according to claim 1, characterized in that the interspaces are filled with an amorphous phase.

4. Electronic device according to claim 1, characterized in that it comprises intercalated columns of two different discotic materials.

5. Electronic device according to claim 1, characterized in that the discotic material is chosen from the group consisting of phthalocyanines and triphenylenes.

6. Electronic device according to claim 5, characterized in that said discotic material comprises a triphenylene substituted with an acceptor group.

7. Electronic device according to claim 6, characterized in that said acceptor group is a trifluorosulphonic acid derivate.

8. Electronic device according to claim 1, characterized in that it is an optoelectronic device.

9. Electronic device according to claim 8, characterized in that it is a photovoltaic cell.

10. Electronic device according to claim 8, characterized in that said interspaces between the columns are filled with an amorphous phase of n-type oxadiazole.

11. Electronic device according to claim 1, characterized in that it is an image sensor comprising a plurality of light detecting regions, each comprising a columnar structure of a discotic material, and is adapted for detecting different light wavelengths in different light detecting, regions.

12. Electronic device according to claim 1, characterized in that it is an electroluminescent device.

13. Method of forming an electronic structure comprising the steps of:

applying a first layer of essentially parallely oriented discotic molecules to a substrate, depositing a second layer of a discotic material on said first layer, the material of said second layer being capable of forming a columnar discotic phase of the material of said first layer, said second layer containing interspaces between columns of discotic material opening to the surface of the second layer, introducing a second material having delectric properties different from those of the material of said second layer into at least some of the interspaces of said second layer.

14. Method according to claim 13, characterized by the step of crosslinking the molecules of the second layer into at lease some of the interspaces of said second layer.

15. Method according to claim 13, characterized in that said first layer is linked to said substrate by chemisorption.

16. Method according to claim 13, characterized in that the second layer of discotic material deposited on said first layer is treated with a solvent to introduce defects, thereby creating or increasing interspaces between the columns.

17. Method according to claim 13, characterized in that the material of the second layer is deposited in a mixture with another material and that said other material is removed after deposition.

18. Method according to claim 13, characterized in that the step of depositing the second layer comprises the step of depositing said discotic material with one or more defect inducing steric groups and that it furthermore comprises the step of subsequently disassociating said steric groups from said discotic material.

19. Method according to claim 13, characterized by the step of depositing an intermediate, essentially defect-free layer of a discotic material on said first layer prior to depositing said second layer.

20. An electronic device comprising two adjacent regions of materials with different electric properties, characterized in that one of the regions is formed by a columnar structure of a discotic liquid crystal material, said structure having interspaces defined between columns of said discotic liquid crystal material, wherein said interspaces are part of the second region and are filled with a second material that has a conductivity which is different from that of said discotic liquid crystal material so that a p-n junction is formed in the region of said columns.

* * * * *